United States Patent [19]

Nickel

[11] Patent Number: 5,454,160
[45] Date of Patent: Oct. 3, 1995

[54] APPARATUS AND METHOD FOR STACKING INTEGRATED CIRCUIT DEVICES

[75] Inventor: Donald F. Nickel, West Columbia, S.C.

[73] Assignee: NCR Corporation, Dayton, Ohio

[21] Appl. No.: 161,738

[22] Filed: Dec. 3, 1993

[51] Int. Cl.⁶ .......................... H05K 3/34; H01L 23/495; H01R 9/09
[52] U.S. Cl. .................. 29/840; 29/740; 29/827; 29/830; 228/180.22; 257/737; 257/774; 257/778; 439/65
[58] Field of Search .............. 29/827, 830, 832, 29/834, 840, 740, 759, 760; 228/6.2, 180.21, 180.22; 437/206, 207; 174/16.3; 257/778, 779, 676, 737, 774, 777, 675, 686, 713; 439/65, 68, 74

[56] References Cited

U.S. PATENT DOCUMENTS

| | | | |
|---|---|---|---|
| 3,868,765 | 3/1975 | Hartleroad et al. | 29/740 X |
| 3,914,850 | 10/1975 | Coucoulas | 29/827 X |
| 3,984,860 | 10/1976 | Logue | 257/737 X |
| 4,021,838 | 5/1977 | Warwick | 257/737 X |
| 4,079,509 | 3/1978 | Jackson et al. | 29/759 X |
| 4,774,760 | 10/1988 | Seaman et al. | 29/840 |
| 4,801,992 | 1/1989 | Golubic | 257/737 X |
| 4,825,284 | 4/1989 | Soga et al. | 257/778 X |
| 4,954,878 | 9/1990 | Fox et al. | 439/68 X |
| 5,019,673 | 5/1991 | Juskey et al. | 257/778 X |
| 5,046,953 | 9/1991 | Shreeve et al. | 29/840 X |
| 5,058,265 | 10/1991 | Goldfarb | 228/180.22 X |
| 5,065,227 | 11/1991 | Frankeny et al. | 257/700 X |
| 5,072,289 | 12/1991 | Sugimoto et al. | 257/737 |
| 5,103,290 | 4/1992 | Temple et al. | 257/774 |
| 5,111,279 | 5/1992 | Pasch et al. | 257/779 X |
| 5,168,346 | 12/1992 | Pasch et al. | 257/778 X |
| 5,173,574 | 12/1992 | Kraus | 29/840 X |
| 5,191,511 | 3/1993 | Sawaya | 257/737 X |
| 5,219,377 | 6/1993 | Poradish | 29/840 X |

FOREIGN PATENT DOCUMENTS

| | | |
|---|---|---|
| 248907 | 8/1987 | Germany . |
| 189945 | 9/1985 | Japan . |
| 152031 | 7/1986 | Japan . |

OTHER PUBLICATIONS

Direct Light–Chip Interconnection Scheme Accommodating Flip–Chip Bonding; IBM Technical Disclosure Bulletin, vol. 33, No. 8; Jan. 1991; pp. 141–142.

*Primary Examiner*—Peter Vo
*Attorney, Agent, or Firm*—Paul W. Martin

[57] ABSTRACT

An apparatus and method for stacking integrated circuit devices which combine flip-chip technology and soldering methods with laminated stack frames to provide a vertical stack array with minimal parasitic inductance. Each laminated stack frame has a central cavity and includes a plurality of vias extending through them. The vias have top surfaces and bottom surfaces, wherein the bottom surfaces each contain a solder bump. Each laminated stack frame also includes a plurality of solder bump pads extending into the cavity to contact corresponding solder bumps on a flip-chip integrated circuit chip, and a plurality of traces coupling each solder bump pad to a via. The bottom surfaces of the vias of a bottom laminated stack frame couple to contacts on a printed circuit board.

13 Claims, 3 Drawing Sheets

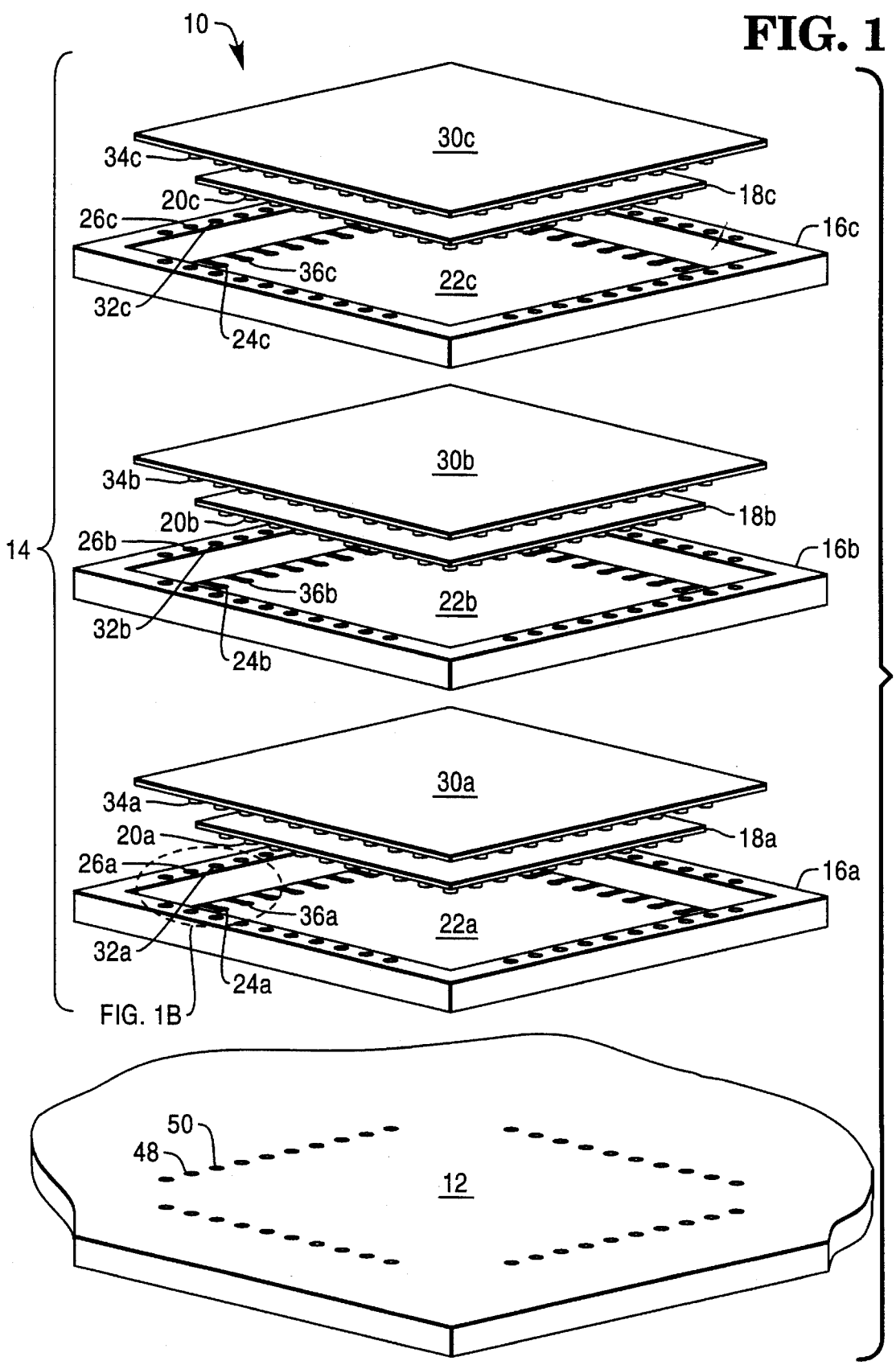

APPARATUS AND METHOD FOR STACKING INTEGRATED CIRCUIT DEVICES

BACKGROUND OF THE INVENTION

The present invention relates to integrated circuit mounting techniques, and more specifically to an apparatus and method for stacking integrated circuit devices.

As computers get smaller, printed circuit board area also tends to get smaller. At the same time, computers are becoming more powerful, causing problems with fitting circuitry into a limited printed circuit board area. For example, a major problem exists in mounting cache and RAM memory onto printed circuit boards. Newer, more powerful computers require larger amounts of cache and RAM memory for server operation, multi-tasking operation, sound processing, moving video processing, and graphics processing.

One proposal for solving this problem is to stack multiple laminate layers, such as those manufactured by Staktek, Inc., and RTB Technologies, Inc., one on top of the other. Each laminate layer provides a frame within which a SRAM or DRAM chip is mounted, as well as connections to the chip and other laminate layers. The RAM chips are connected to the laminate frames by a wire bonding process known in the art.

However, the wire bonding method suffers from the disadvantage that the bond wire is a major contributor to signal parasitic inductance, especially if the wire loop length is not strictly minimized. As processor and cache clock frequencies increase, parasitic inductance distorts signals between the processor and a planar array of multiple cache chips.

Therefore, it would be desirable to provide a method for stacking integrated circuit chips, such as cache and RAM chips, which minimizes signal parasitic inductance. The present invention proposes that modern flip-chip technology be used instead of wire bonding methods. An excellent discussion of flip-chip process steps may be found in the book "Multichip Module Technologies And Alternatives: The Basics", edited by Daryl Ann Doane and Paul D. Franzon, and published by Van Nostrand-Reinhold, New York, in 1993. This book is hereby incorporated by reference.

The basic connection scheme consists of die input/output (I/O) pads that have had solder bumps applied, plus a matching set of substrate solder wettable pads. The die I/O pads are formed by etching vias through the passivation layer followed by hermetically sealing the via by evaporating layers of chromium, copper, or gold through an appropriate mask. A solder alloy is then deposited on the pad to form the solder bump. The melting point of the solder is high enough to ensure compatibility with subsequent assembly steps. Meanwhile, the substrate solder wettable pads are formed so molten solder is restrained from flowing outward from the bump causing a controlled collapse of the bump during the subsequent solder reflow step. The reflow step can be achieved in a vapor-phase or infrared oven or by a localized heat source.

SUMMARY OF THE INVENTION

In accordance with the teachings of the present invention, an apparatus and method for stacking integrated circuit devices are provided. The present invention combines flip-chip technology and soldering methods with laminated stack frames to provide a vertical stack array with minimal parasitic inductance. Each laminated stack frame has a central cavity and includes a plurality of vias extending through them. The vias have top surfaces and bottom surfaces, wherein the bottom surfaces each contain a solder bump. Each laminated stack frame also includes a plurality of solder bump pads extending into the cavity to contact corresponding solder bumps on a flip-chip integrated circuit chip, and a plurality of traces coupling each solder bump pad to a via. The bottom surfaces of the vias of a bottom laminated stack frame couple to contacts on a printed circuit board.

The present invention also includes high thermal conductivity layers on top of the integrated circuit chips. Each high thermal conductivity layer has solder bumps around its periphery. The solder bumps couple to solder bump pads associated with heat conducting vias extending through the laminated stack frames to the printed circuit board.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

FIG. 1 contains an exploded perspective view of the integrated circuit mounting apparatus of the present invention;

DETAILED DESCRIPTION OF THE PREFERRED EMBODIMENT

Figure 1B:
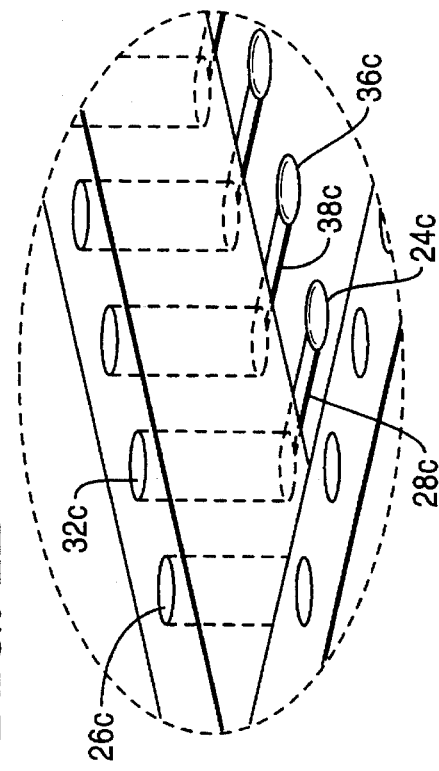
FIG. 1B contains a blowup of an area circled in FIG. 1.
Figure 2:
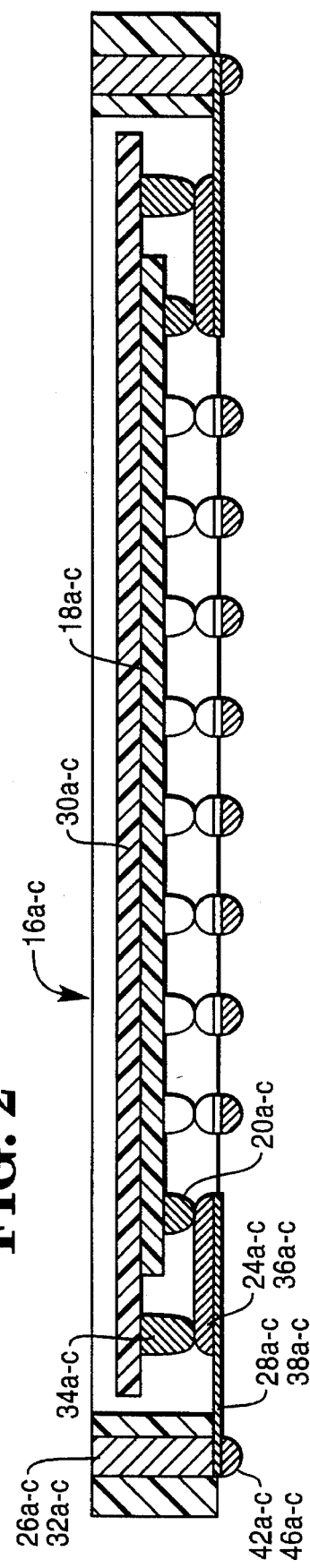
FIG. 2 is a cross-sectional view of a laminated stacking frame illustrating the connections between an integrated circuit chip and the frame and between a high thermal conductivity layer and the frame.

Referring now to FIGS. 1–4, computer circuit assembly 10 includes printed circuit board 12, and vertical circuit stack 14.

Vertical circuit stack 14 includes laminated stack frames 16a–c and integrated circuit chips 18a–c. Vertical circuit stack 14 occupies space on printed circuit board 12 only slightly larger than the space of a single integrated circuit chip. Although only one vertical stack 14 and three laminated stack frames 16a–c, and three integrated circuit chips 18a–c are shown in the drawing, the present invention envisions any number of stacks and stack frames arranged in a three-dimensional array.

Integrated circuit chips 18a–c are preferably flip-chips, having solder bumps 20a–c around the peripheries of each chip or an array of solder bumps distributed over the face of the die. In particular, integrated circuit chips 18a–c are preferably flip-chip SRAM or DRAM chips for use in cache or system memory.

Laminated stack frames 16a–c are preferably similar to those manufactured by Staktek, Inc., or RTB Technologies, Inc., and contain cavities 22a–c. Under the method of the present invention, cavities 22a–c provide space for integrated circuit chips 18a–c to be flip-chip soldered to solder bump pads 24a–c at the bottom of cavities 22a–c. Signal conducting vias 26a–c extend through laminated stack frames 16a–c and provide signal, power, and ground connections to integrated circuit chips 18a–c. Signal conducting vias 26a–c couple to solder bump pads 24a–c through traces 28a–c. Traces 28a–c are short impedance-controlled traces under laminated stack frame 16a–c (FIG. 1B).

Advantageously, heat generated by integrated circuit chips 18a–c is conducted away by solder bump pads 24a–c to signal conducting vias 26a–c. Heat may also be conducted away from integrated circuit chips 18a–c by providing high thermal conductivity layers 30a–c on top of integrated circuit chips 18a–c. High thermal conductivity layers 30a–c may be made of copper or deposited diamond film. Thermal grease is applied between high thermal conductivity layers 30a–c and integrated circuit chips 18a–c to enhance thermal conductivity. High thermal conductivity layers 30a–c may be coupled to unused vias as heat conducting vias 32a–c in laminated frames 16a–c through solder bumps 34a–c on high thermal conductivity layers 30a–c, which make contact with solder bump pads 36a–c. Solder bump pads 36a–c contact heat conducting vias through heat conducting traces 38a–c. If diamond film is used in high thermal conductivity layers 30a–c, heat conducting vias 32a–c must provide high thermal conductivity through stack 14 to printed circuit board 12. If copper laminates are employed, care must be taken to avoid electrical contact between the copper laminates and signal conducting vias 26a–c. High thermal conductivity layers 30a–c extend beyond the edges of integrated circuit chips 18a–c so as to allow solder bumps 34a–c to avoid contact with integrated circuit chips 18a–c.

Figure 3:
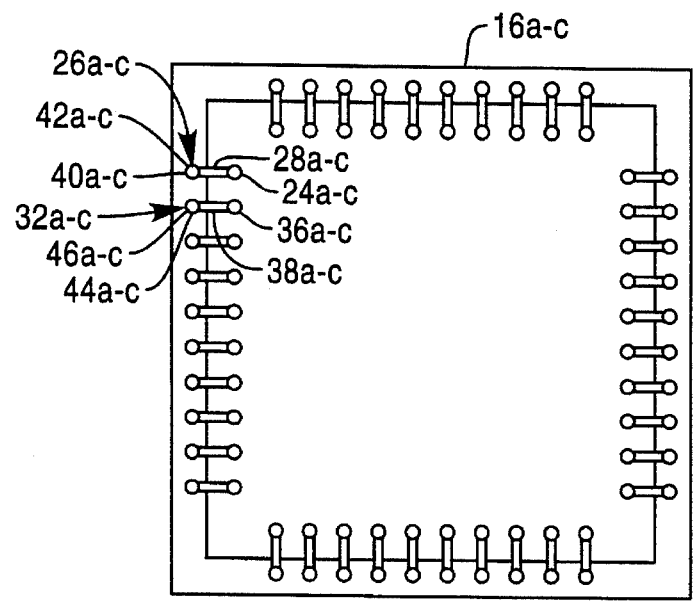
FIG. 3 contains a bottom view of a laminated stacking frame.
Figure 4:
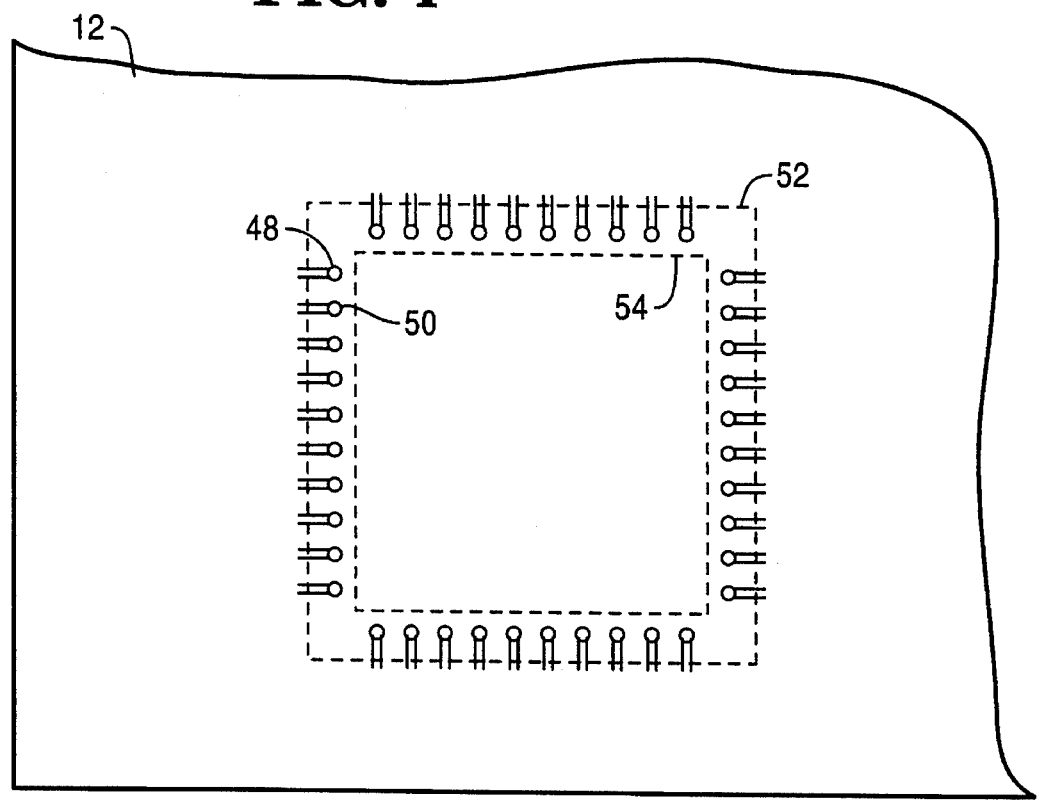
FIG. 4 contains a top view of the area of the printed circuit board upon which the bottom laminated stacking frame is mounted.

With reference to FIG. 3, bottom surfaces 40a–c of signal conducting vias 26a–c include solder bumps 42a–c. Bottom surfaces 44a–c of heat conducting vias 32a–c include solder bumps 46a–c. Bottom solder bumps 42b couple signal vias 26b to signal vias 26a and bottom solder bumps 42c couple signal vias 26c to signal vias 26b. Bottom solder bumps 42a couple signal vias 26a to contacts 48 on printed circuit board 12 (FIG. 4). Bottom solder bumps 46b couple heat conducting vias 32b to heat conducting vias 32a and bottom solder bumps 46c couple heat conducting vias 32c to heat conducting vias 32b. Bottom solder bumps 46a couple heat conducting vias 32a to contacts 50 on printed circuit board 12 (FIG. 4).

With reference to FIG. 4, the projection of laminated stack frame 16a on printed circuit board 12 is shown within dotted lines 52 and 54. Signal conducting vias 26a couple to contacts 48 on printed circuit board 12, while heat conducting vias 32a couple to contacts 50 on printed circuit board 12. Both contacts 48 and 50 are between dotted lines 52 and 54.

For RAM chips, a signal common to all RAM chips (such as power and ground) enters and leaves through one of contacts 48. From the one contact, the signal travels through one of each of signal conducting vias 26a–c, through one of each of traces 28a–c to one of each of solder bump pads 24a–c, and finally to one of each of solder bumps 20a–c. In addition to common signals, each RAM chip requires its own set of signals, and therefore, dedicated paths for these signals. Thus, dedicated vias and solder bump pads are established for these signals.

Although the present invention has been described with particular reference to certain preferred embodiments thereof, variations and modifications of the present invention can be effected within the spirit and scope of the following claims.

What is claimed is:

1. An apparatus for mounting a flip-chip integrated circuit chip to a printed circuit board comprising:

a laminated stack frame having a central cavity and including a plurality of vias extending through the laminated stack frame, wherein the vias have top surfaces and bottom surfaces, wherein the bottom surfaces each contain a solder bump which is coupled to a contact on the printed circuit board, the laminated stack frame also including a plurality of solder bump pads extending into the cavity to contact corresponding solder bumps on the flip-chip integrated circuit chip, and a plurality of traces coupling each of the solder bump pads to a corresponding via.

2. The apparatus as recited in claim 1, further comprising:

a heat conducting plate mounted on the integrated circuit chip.

3. The apparatus as recited in claim 2, wherein the heat conducting plate comprises a plurality of solder bumps around its periphery, wherein the laminated stack frame further comprises:

a plurality of heat conducting vias extending through the laminated stack frame and having top surfaces and bottom surfaces, wherein the bottom surfaces each contain a solder bump which is coupled to a contact on the printed circuit board, the laminated stack frame also including a plurality of solder bump pads extending into the cavity to contact corresponding solder bumps on the heat conducting plate, and a plurality of heat conducting traces coupling each solder bump pad to a heat conducting via.

4. The apparatus as recited in claim 1, wherein the integrated circuit chip comprises a RAM chip.

5. An apparatus for mounting a flip-chip integrated circuit chip to a printed circuit board comprising:

a first laminated stack frame having a central cavity and including a plurality of vias extending through the first laminated stack frame, wherein the vias of the first laminated stack frame have top surfaces and bottom surfaces, wherein the bottom surfaces each contain a solder bump, the first laminated stack frame also including a plurality of solder bump pads extending into the cavity to contact corresponding solder bumps on a first flip-chip integrated circuit chip, and a plurality of traces coupling each of the solder bump pads to a corresponding via; and a second laminated stack frame below the first laminated stack frame having a central cavity and including a plurality of vias extending through the second laminated stack frame, wherein the vias of the second laminated stack frame have top surfaces and bottom surfaces, wherein the top surfaces contact the bottom surfaces of the vias of the first laminated stack frame and wherein the bottom surfaces each contain a solder bump which couples to a contact on the printed circuit board, the second laminated stack frame also including a plurality of solder bump pads extending into the cavity to contact corresponding solder bumps on a second flip-chip integrated circuit chip, and a plurality of traces coupling each of the solder bump pads to a corresponding via.

6. The apparatus as recited in claim 5, further comprising:

first and second heat conducting plates mounted on the first and second integrated circuit chips.

7. The apparatus as recited in claim 6, wherein the second heat conducting plate comprises a plurality of solder bumps around its periphery, wherein the second laminated stack frame further comprises:

a plurality of heat conducting vias extending through the second laminated stack frame and having top surfaces and bottom surfaces, wherein the bottom surfaces each contain a solder bump which couples to a contact on the printed circuit board, the second laminated stack frame also including a plurality of solder bump pads extending into the cavity to contact corresponding solder bumps on the second heat conducting plate, and a plurality of heat conducting traces coupling each solder bump pad to a heat conducting via.

8. The apparatus as recited in claim 7, wherein the first heat conducting plate comprises a plurality of solder bumps around its periphery, wherein the first laminated stack frame further comprises:

a plurality of heat conducting vias extending through the first laminated stack frame and having top surfaces and bottom surfaces, wherein the bottom surfaces each contain a solder bump for contacting the heat conducting vias of the second laminated stack frame, the first laminated stack frame also including a plurality of solder bump pads extending into the cavity to contact corresponding solder bumps on the first heat conducting plate, and a plurality of heat conducting traces coupling each solder bump pad to a heat conducting via.

9. The apparatus as recited in claim 5, wherein the integrated circuit chips comprise RAM chips.

10. A method for mounting a plurality of flip-chip integrated circuit chips to a printed circuit board comprising the steps of:

providing a first laminated stack frame including a central cavity and a plurality of vias extending through the first laminated stack frame and having top surfaces and bottom surfaces, wherein the bottom surfaces each contain a solder bump;

coupling a trace extending into the cavity to each of the vias;

coupling a solder bump pad to each of the traces;

coupling a plurality of solder bumps on a first flip-chip integrated circuit chip to the solder bump pads;

providing a second laminated stack frame having a central cavity and including a plurality of vias extending through the second laminated stack frame and having top surfaces and bottom surfaces, wherein the bottom surfaces each contain a solder bump;

coupling a trace extending into the cavity of the second laminated stack frame to each of the vias of the second laminated stack frame;

coupling a solder bump pad to each of the traces of the second laminated stack frame;

coupling a plurality of solder bumps on a second flip-chip integrated circuit chip to the solder bump pads of the second laminated stack frame;

vertically stacking the first laminated stack frame on top of the second laminated stack frame to form a vertical stack array such that the bottom surfaces of each of the vias of the first laminated stack array contact the top surfaces of each of the vias of the second laminated stack frame below; and coupling the vertical stack array on top of the printed circuit board such that the bottom surfaces of the vias of the second laminated stack frame couple to contacts on the printed circuit board.

11. The method as recited in claim 10, further comprising the step of:

mounting first and second heat conducting plates on top of the first and second integrated circuit chips.

12. The method as recited in claim 11, further comprising the steps of:

coupling a plurality of solder bumps to each of the heat conducting plates;

coupling a plurality of heat conducting traces extending into the cavities of the first and second laminated stack frames to the unused vias of the first and second laminated stack frames;

coupling a plurality of heat conducting solder bump pads to the heat conducting traces of the first and second laminated stack frames; and coupling the solder bumps on the first and second heat conducting plates to the heat conducting solder bump pads of the first and second laminated stack frames.

13. The method as recited in claim 10, further comprising the step of:

providing additional laminated stack frames, each having a central cavity and including a plurality of vias extending through the additional laminated stack frames and having top surfaces and bottom surfaces, wherein the bottom surfaces each contain a solder bump;

coupling a trace extending into the cavity of each of the additional laminated stack frames to each of the vias of additional laminated stack frames;

coupling a solder bump pad to each of the traces of the additional laminated stack frames;

coupling a plurality of solder bumps on each of a plurality of additional flip-chip integrated circuit chips to the solder bump pads on corresponding additional laminated stack frames; and vertically stacking the additional laminated stack frames on top of the first laminated stack frame.

* * * * *